US007513778B1

(12) United States Patent
Dar-Shan

(10) Patent No.: US 7,513,778 B1

(45) Date of Patent: Apr. 7, 2009

(54) COAXIAL CONNECTOR

(75) Inventor: Horng Dar-Shan, Taoyuan Hsien (TW)

(73) Assignee: Speed Tech Corp., Kwei-Shan Hsiang, Taoyuan Hsien (TW)

( * ) Notice: Subject to any disclaimer, the term of this patent is extended or adjusted under 35 U.S.C. 154(b) by 0 days.

(21) Appl. No.: 12/068,615

(22) Filed: Feb. 8, 2008

(51) Int. Cl.
*H01R 12/00* (2006.01)
*H05K 1/00* (2006.01)

(52) U.S. Cl. ........................................ 439/63; 439/188

(58) Field of Classification Search .................. 439/63, 439/188, 247, 578, 135
See application file for complete search history.

(56) References Cited

U.S. PATENT DOCUMENTS 7,217,137 B1 * 5/2007 Nakagawa .................. 439/63

* cited by examiner

*Primary Examiner*—Javaid Nasri
(74) *Attorney, Agent, or Firm*—Muncy, Geissler, Olds & Lowe PLLC

(57) ABSTRACT

A coaxial connector, comprising an insulating housing, a movable terminal, a stationary terminal, and a shielding casing. The movable terminal and the stationary terminal are respectively connected in the insulating housing. The insulating housing comprises an insulating covering and an insulating base, wherein the insulating covering and the insulating base together define a containment space. The containment space may provide an open space for assembly of the stationary terminal and the movable terminal. The shielding casing substantially covers the insulating housing and provides the insulating housing with shielding protection.

7 Claims, 7 Drawing Sheets

COAXIAL CONNECTOR

FIELD OF THE INVENTION

The present invention relates to a coaxial connector, particularly to a coaxial connector having a good assembly.

BACKGROUND OF THE INVENTION

FIG. 4 is a cross-sectional side view of the "Coaxial Connector Having a Switch" disclosed in the U.S. Pat. No. 7,217,137. According to the illustration, the coaxial connector 5 of the conventional art can be mounted on a circuit board (not shown), and comprises an insulating housing 51, an outer conductor 53, a stationary terminal 55, and a movable terminal 57. The insulating housing 51 having a hole 511 to receive the center conductor of the coaxial plug (not shown) that is inserted from the top to the bottom. The outer conductor 53 is disposed at the outer side of the insulating housing 51, and can be attached to/detached from the outer conductor (not shown) of the aforementioned coaxial plug to form an attachment or detachment with the outer conductor of the coaxial plug. A stationary terminal 55 and a movable terminal 57 are provided below the hole 511, and can contact to/be away from each other. The stationary terminal 55 has a contact section 551, and the movable terminal 57 has a secure section 571 and an elastic section 573. The secure section 571 secures the movable terminal 57 in a predetermined position in the insulating housing 51. The elastic section 573 extends from the secure section 571, and is disposed into the insulating housing 51 through an inserting hole 513 of the insulating housing 51. The elastic section 573 of the movable terminal 57 can contact the center conductor of the coaxial plug and the contact section 551 of the stationary terminal 55 to form an electrical connection. Specifically, when the center conductor of the coaxial plug is not inserted into the insulating housing 51 of the coaxial connector 5, the elastic section 573 of the movable terminal 57 supports a cantilever 553 that supports the contact section 551 of the stationary terminal 55, such that an electrical connection is formed between the elastic section 573 of the movable terminal 57 and the contact section 551 of the stationary terminal 55. On the other hand, when the center conductor of the coaxial plug is inserted into the insulating housing 51 of the coaxial connector 5, the outer conductor of the coaxial plug fits the outer conductor 53 of the coaxial connector 5 and the elastic section 573 of the movable terminal 57 is pressed down, so that the elastic section 573 of the movable terminal 57 is detached from the contact section 551 of the stationary terminal 55 at the same time, thus removes the electrical connection therebetween. Accordingly, when attaching or detaching the coaxial plug to the coaxial connector 5 of the conventional art, different electrical connections can be formed respectively. Therefore, different electrical loops can be triggered resulting in a switch having a selective function.

From the manufacturing point of view, the above mentioned movable terminal 57 is first inserted into the inserting hole 513 on a side of the insulating housing 51, and then the stationary terminal 55 is inserted into the opposite side of the insulating housing 51. At the same time, the elastic section 573 of the movable terminal 57 must be pressed down first, and then the elastic section 573 of the movable terminal 57 is expected to return by elastic force to its original vertical position before being pressed down so that the elastic section 573 of the movable terminal 57 is pushed against the contact section 551 of the stationary terminal 55 to form an electrical connection. However, from the perspective of the assembler, during the aforementioned assembly process of inserting the movable terminal 57 and the stationary terminal 55 into the insulation housing 51 sequentially, the movable terminal 57 and the stationary terminal 55 are hidden inside the insulating housing 51 and invisible to the assembler. If the elastic section 573 of the movable terminal 57 does not return upward by the elastic force as expected to the exact vertical position and press against the contact section 551 of the stationary terminal 55, the coaxial connector 5 cannot achieve the switching function. These various ways cannot ensure the reliability of the quality and usage of a finished product of the coaxial connector.

SUMMARY OF THE INVENTION

It is an object of the present invention to provide a coaxial connector and particularly a coaxial connector having a good assembling structure.

In order to achieve the aforementioned object, the present invention provides a coaxial connector including an insulating housing, a movable terminal, a stationary terminal and a shielding casing. The stationary terminal and the movable terminal may be respectively disposed in the insulating housing. The insulating housing includes an insulating covering and an insulating base. The insulating covering and the insulating base together define a containment space. The containment space may provide an open space for assembly of the movable terminal and the stationary terminal. The shielding casing substantially covers the insulating housing to provide the insulating housing with shielding protection.

Based on the aforementioned, the movable terminal and the stationary terminal are disposed within the containment space. In comparison with the conventional art, the coaxial connector of the present invention has a good assembly; therefore, the contact status between the movable terminal and the stationary terminal may easily be seen and adjusted in the assembly process thus ensuring that the coaxial connector has a good electrical behavior and assembly quality.

Other objects, advantages, and novel features of the invention will become more apparent from the following detailed description when taken in conjunction with the accompanying drawing.

DETAILED DESCRIPTION OF THE PREFERRED EMBODIMENT

The present invention provides a coaxial connector suitable to assemble on a circuit board and can be connected to an external coaxial plug. The coaxial connector has a good assembling structure, and can ensure that assembled products have good electrical behavior and assembly quality.

Figure 1:
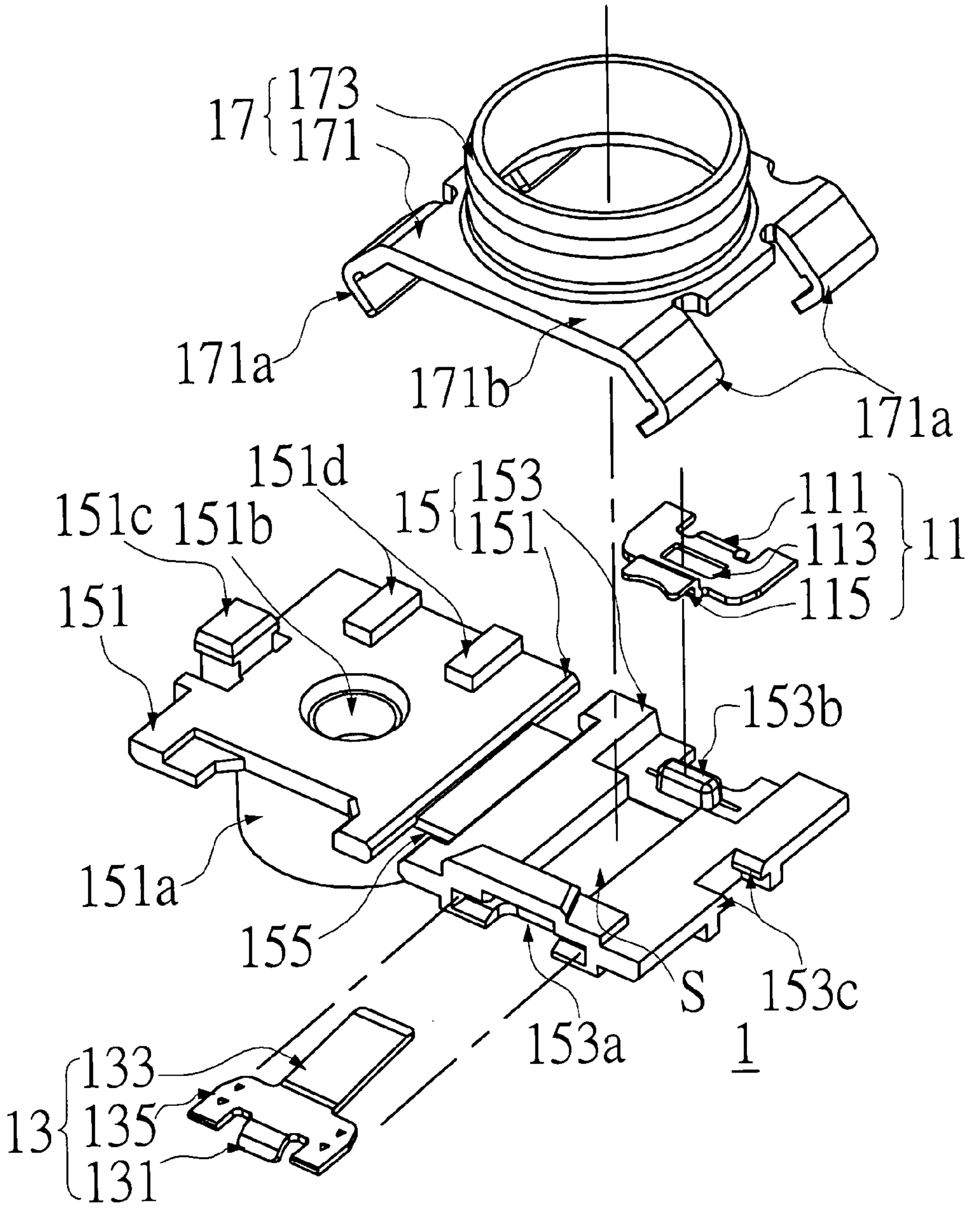
FIG. 1 is an exploded perspective view of the coaxial connector of the present invention.
Figure 2A:
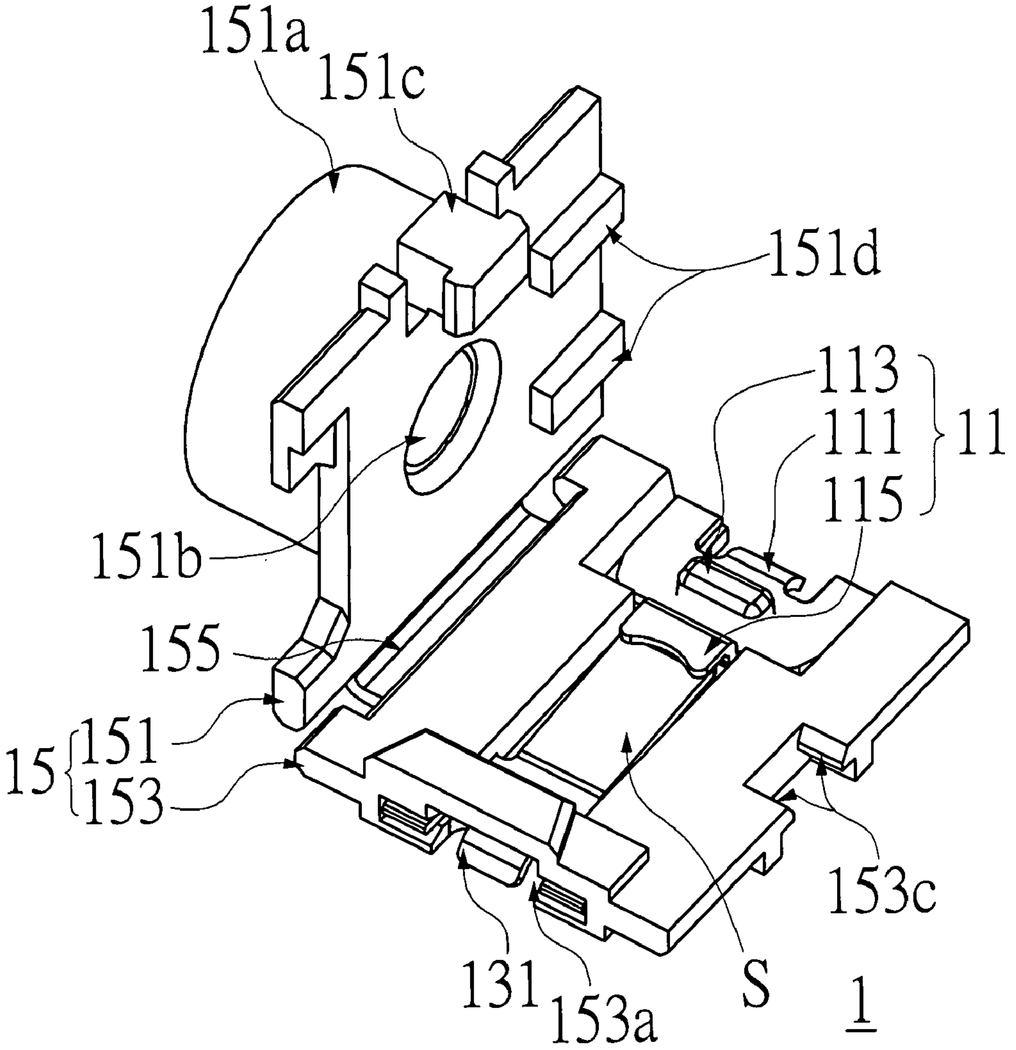
FIGS. 2A, 2B and 2C are continuous schematic drawings of the coaxial connector of the present invention.
Figure 2B:
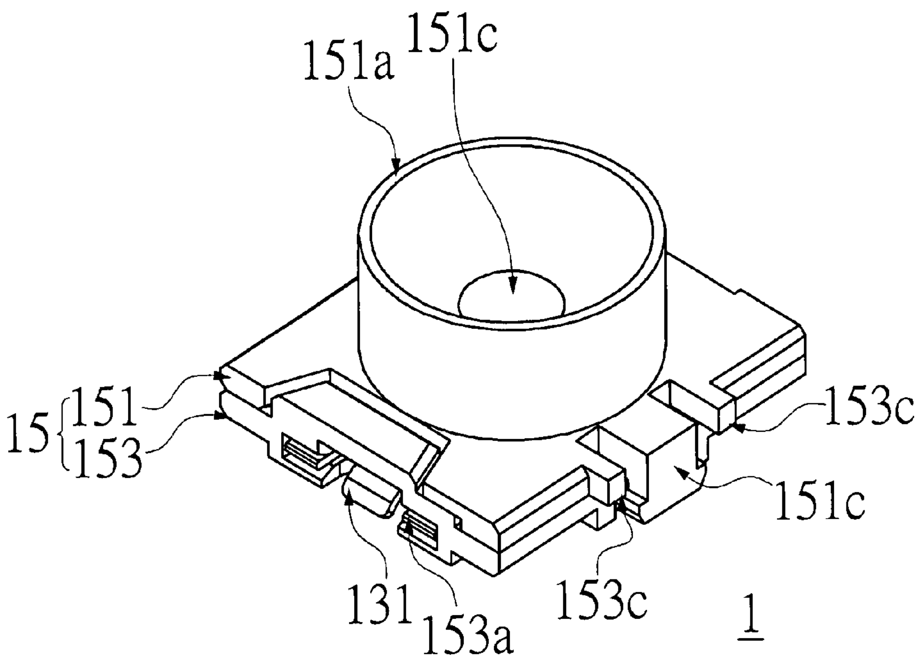
Figure 2C:
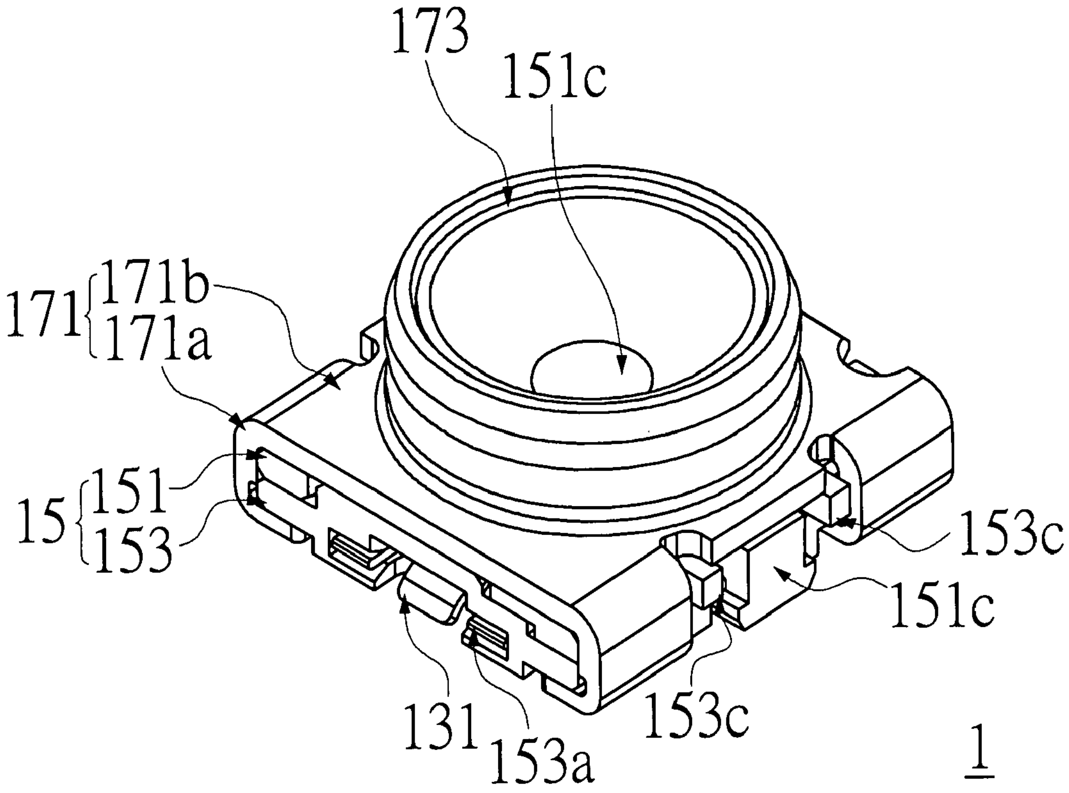
Figure 3A:
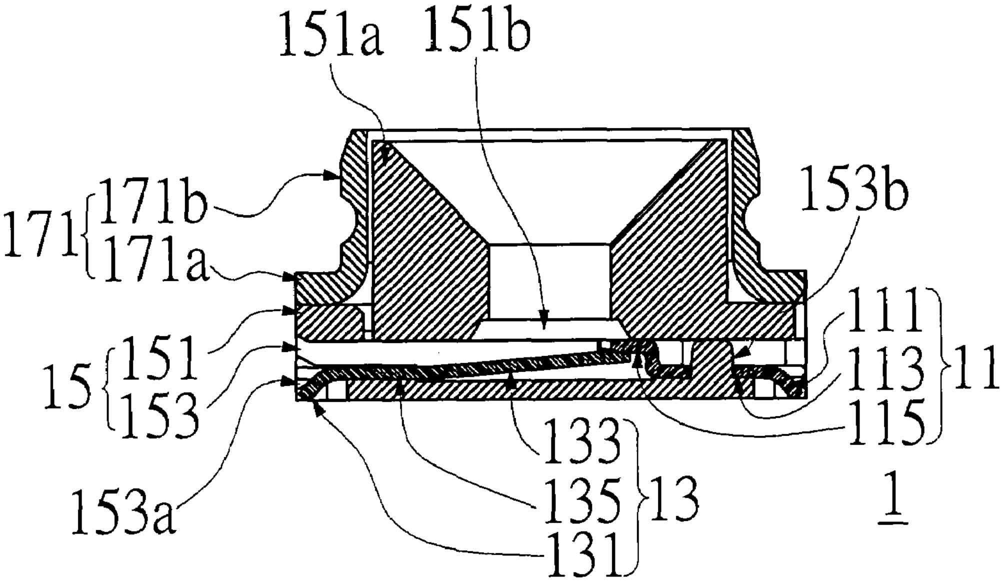
FIG. 3A is a cross-sectional side view of the coaxial connector of the present invention before being connected.
Figure 3B:
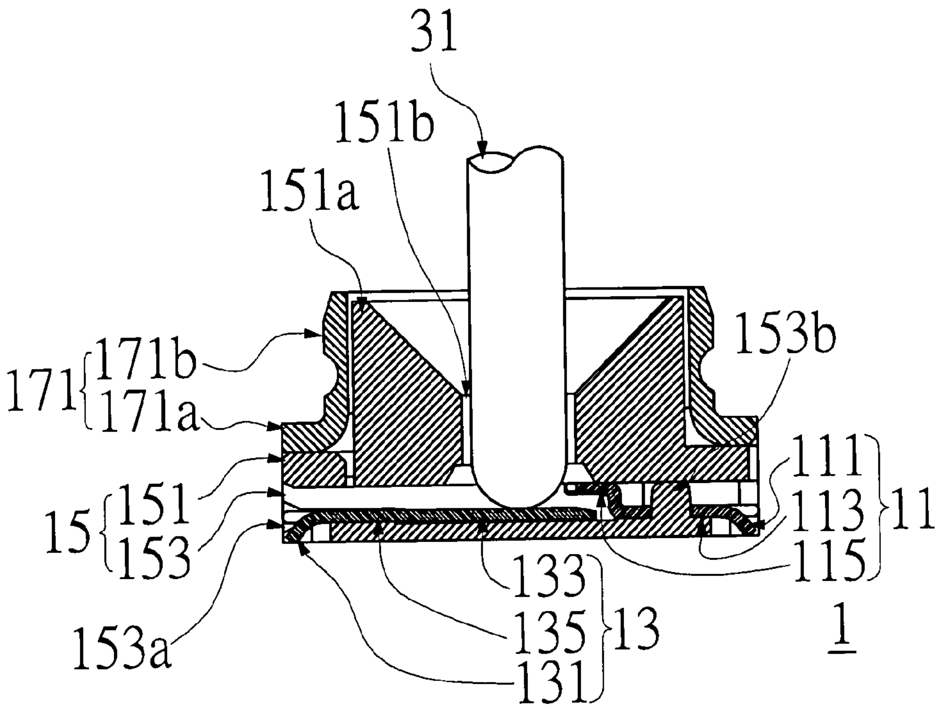
FIG. 3B is a cross-sectional side view of the coaxial connector of the present invention after being connected.
Figure 4:
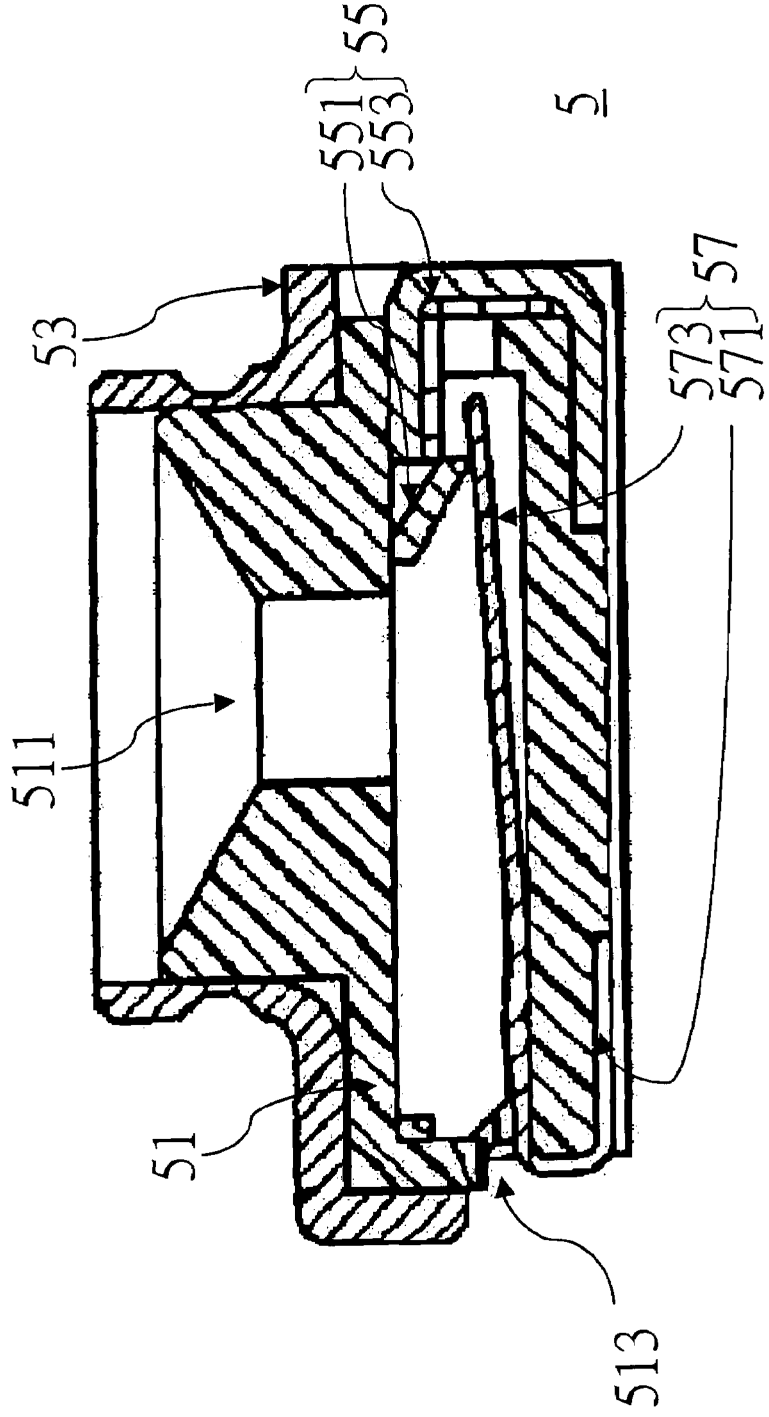
Fig. 4 (Prior Art)
FIG. 4 is a cross-sectional side view of the coaxial connector of the conventional art.

Refer to FIG. 1, FIG. 2 and FIG. 3. FIG. 1 is an exploded perspective view of a coaxial connector of the present invention. FIGS. 2A, 2B and 2C are continuous schematic drawings showing the assembly of the coaxial connector of the present invention. FIG. 3A is a cross-sectional side view of the coaxial connector of the present invention before being connected. FIG. 3B is a cross-sectional side view of the coaxial connector of the present invention after being connected. According to the illustrations, the coaxial connector 1 of the present invention comprises a stationary terminal 11, a movable terminal 13, an insulating housing 15, and a shielding casing 17. The stationary terminal 11 is made of a metal sheet and has a welding portion 111 which may be welded onto an external circuit board (not shown). The movable terminal 13 is made of a metal sheet and has a welding portion 131 which may be welded onto the aforementioned circuit board.

The insulating housing 15 is a carrier made of insulating material for disposing the aforementioned stationary terminal 11 and the movable terminal 13. The insulating housing 15 may also be divided into an insulating covering 151 and an insulating base 153 stacked together. The insulating covering 151 is substantially a thin plate, and an extension 151*a* is located around the center of the upper surface of the insulating covering 151. The outer shape of the extension 151*a* matches a shape of a coaxial plug (not shown). The extension 151*a* has a through hole 151*b* for inserting therein the center conductor (not shown) of the coaxial plug butt jointed with the coaxial connector 1 of the present invention. The aperture of the through hole 151*b* is substantially the same or slightly larger than the outer diameter of the center conductor of the coaxial plug. According to an embodiment of the present invention, the insulating base 153 of the insulating housing 15 can be disposed on the aforementioned circuit board, and the insulating covering 151 of the insulating housing 15 can be used to covers the insulating base 153. The insulating covering 151 and insulating base 153 together define a containment space S. The through hole 151*b* of the insulating covering 151 attaches to one surface of the containment space S. For example, according to an embodiment of the present invention, the through hole 151*b* is attached to the top surface of the containment space S. The insulating base 153 has a slot 153*a* disposed at one short side of the containment space S and connected to the containment space S. The movable terminal 13 may be inserted into the containment space S through the slot 153*a*. The insulating base 153 has a bump 153*b* disposed at the other short side of the containment space S and thus the two short sides of the containment space S are facing to each other. The bump 153*b* may engage with the opening 113 of the stationary terminal 11 thus securing the stationary terminal 11 to the insulating base 153, wherein the opening 113 is, for example, disposed near the center of the stationary terminal 11 as a thin plate. Specifically, the slot 153*a* is attached to a portion of the containment space S whereby a tab 133 of the movable terminal 13 is inserted into the containment space S through the slot 153*a*. On the other hand, the inner edge of the slot 153*a* may engage with the engaging portion 135 of the movable terminal 13 thus securing the movable terminal 13 on the insulating base 153. It should be noted that, the stationary terminal 11 and the movable terminal 13 are secured on two short sides of the containment space S of the insulating base 153, respectively. The stationary terminal 11 contacts with the leading edge of the tab 133 of the movable terminal 13 and together form an electrical loop among the stationary terminal 11, the movable terminal 13 and the circuit board. It should be noted that, the design of the present invention merely requires the stationary terminal to contact with the leading edge of the tab of the movable terminal. Therefore, in another embodiment of the present invention, the insulating base has a slot disposed at one short side of the containment space, and the insulating base may have a bump disposed at, for example, a side perpendicular to said short side of the containment space (not shown). Briefly, the stationary terminal and the leading edge of the tab of the movable terminal are vertically contacted in this embodiment. However, this embodiment does not influence the original intention of the design of the present invention, and also does not influence the intended object of the present invention.

The shielding casing 17 is made of a metal sheet and comprises a base 171 and a sleeve 173. The base 171 substantially covers the outer side of the insulating housing 15 and provides shielding protection for the insulating housing 15. Specifically, the base 171 spans over the top side of the insulating covering 151, and a plurality of lateral wings 171*a* of the base 171 cover the outer sides of the insulating covering 151 and the insulating base 153. The sleeve 173 is disposed on the base 171 and is connected to a top surface 171*b* of the base 171. The sleeve 173 substantially covers outer surface of the extension 151*a* of the insulating covering 151, and the shape of the sleeve 173 may match the aforementioned outer conductor of the coaxial plug (not shown), wherein the diameter of the sleeve 173 is substantially the same or slightly bigger than the diameter of the outer conductor of the coaxial plug. Specifically, a circular hole that may match the shape of the sleeve is drilled on the top surface 171*b* of the base 171. When the coaxial plug and coaxial connector are matched, the sleeve 173 of the shielding casing 17 and the extension 151*a* of the insulating housing 15 may together hold the outer conductor of the coaxial plug, and allow the center conductor of the coaxial plug to pass through the circular hole on the top surface 171*b* of the base 171, and then further through the through hole 151*b* of the insulating covering 151, and then be inserted into the containment space S, and then pushes the tab 133 of the movable terminal 13 shift downwardly. The amount of the downward shift is sufficient enough to keep the stationary terminal 11 and the tab 133 of the movable terminal 13 at an appropriate distance so that the electrical loop among the aforementioned stationary terminal 11, the movable terminal 13 and the circuit board could be cutoff, and another electrical loop among the center conductor of the coaxial plug, the tab 133 of the movable terminal 13 and the circuit board is formed. Said two different electrical loops may be used to determine whether the coaxial plug and coaxial connector are connected or not. For example, different electrical loops that produce different electrical signals, such as different voltage quantities, that may be utilized to confirm the status of whether the coaxial plug and the coaxial connector are properly attached or not, and carry out transfers of information or power after attachment is entirely completed without damaging the coaxial plug and coaxial connector. This embodiment can reduce the damage caused by improper operations of the coaxial plug or the coaxial connector.

The present invention provides a good assembly, wherein the insulating housing 15 is separated into the lamination of the insulating covering 151 and the insulating base 153, therefore, the insulating covering 151 and the insulating base 153 may be assembled at different times, wherein the insulating covering 151 may be connected or not connected to the insulating base 153. For example, the tab 133 of the movable terminal 13 may first be inserted into the containment space S and the engaging portion 135 of the movable terminal 13 is engaged with the inner edge of the slot 153*a* of the insulating base 153. Then the opening 113 of the stationary terminal 11 is engaged onto the bump 153*b* of the insulating base 153 thus making the tab 133 of the movable terminal 13 touch the stationary terminal 11. Later, cover the insulating covering 151 over the insulating base 153 and secure the stationary terminal 11. Lastly, cover the shielding casing 17 over the insulating housing 15. The advantage of the aforementioned embodiment is that the containment space S provides an open and visible operating space that is beneficial to operations during the assembly process. Unlike the convention art wherein the assembly should be done in a closed space. Therefore, the contact status between the stationary terminal and the tab of the movable terminal may be appropriately adjusted in the assembly process thus improving the electrical behavior between the stationary terminal and the tab of the movable terminal as well as the assembly quality of the whole coaxial connector.

Other than the open containment space S, in order to further ensure the electrical connection between the stationary terminal 11 and the tab 133 of the movable terminal 13, a pressing member 115 may be disposed at and extended from one side of the stationary terminal 11 wherein said side faces the containment space S, i.e., the side that would contact the tab 133 of the movable terminal 13. The pressing member 115 could press against the leading edge of the tab 133 of the movable terminal 13 thereby forming a closer contact and thus a more stable electrical connection between the pressing member 115 of the stationary terminal 11 and the tab 133 of the movable terminal 13 by means of the flexibility of the tab 133. Therefore, the present invention provides a coaxial connector 1 having a good assembly, wherein the contact status between the stationary terminal 11 and the movable terminal 13 may be easily adjusted during the assembly process. The butt jointed coaxial plug can easily trigger different electrical loops before (as shown in FIG. 3A) and after (as shown in FIG. 3B) being inserted, and renders it more apparent and easy to determine whether the coaxial plug is inserted or not. Therefore, the coaxial connector of the present invention has a good electrical behavior and assembly quality.

In an embodiment of the present invention, the insulating housing 15 includes an insulating covering 151 and an insulating base 153. The insulating covering 151 and the insulating base 153 may have a connecting sheet 155 therebetween, and the connecting sheet 155 is respectively connected to a side edge of the insulating covering 151 and insulating base 153. The connecting sheet 155 in itself is made of insulating material, for example, but may be flexed and/or bent within a limited range. When assembling, the aforementioned stationary terminal 11 and movable terminal 13 are first disposed on two sides of the insulating base 153. Then, the insulating covering 151 is flexed along a connecting edge of the connecting sheet 155 so that the insulating covering 151 straddles over the insulating base 153. However, the insulating covering 151 and insulating base 153 cannot rely only on the connecting sheet 155 to couple tightly. Therefore, at least one set of locking mechanisms may be provided to facilitate the insulating covering 151 and insulating base 153 to achieve a tight lock. For example, a fixing portion 151*c* may be disposed on the insulating covering 151, and a corresponding fixing portion 153*c* may be disposed on the insulating base 153 in an appropriate position. The two fixing portions 151*c* and 153*c* may lock with each other to let the insulating covering 151 and insulating base 153 achieve a tight lock. The present invention does not limit the position, type or amount of the fixing portions. Additionally, in an embodiment of the present invention, ribs 151*d* may further be disposed on the insulating covering 151, for example, a paired set of ribs 151*d* is formed on appropriate positions on the insulating covering 151. When the insulating covering 151 and insulating base 153 lock with each other, the ribs 151*d* may press against the two side portions of the aforementioned stationary terminal 11 sheet. This embodiment may provide the stationary terminal 11 with additional downward pressure to achieve a tighter connection between the stationary terminal 11 and the tab 133 of the movable terminal 13.

As is understood by a person skilled in the art, the foregoing preferred embodiments of the present invention are illustrated of the present invention rather than limiting of the present invention. It is intended to cover various modifications and similar arrangements included within the spirit and scope of the appended claims. Therefore, the scope of the present invention should be accorded the broadest interpretation so as to encompass all such modifications and similar structure.

What is claimed is:

1. A coaxial connector, comprising:

an insulating housing, comprising an insulating covering and an insulating base, wherein the insulating covering and insulating base are attached to each other by a connecting sheet made of a tough and flexible material, a surface of the insulating covering having an extension and a shape thereof matches a shape of a coaxial plug, a through hole is disposed at a center of the extension and connected to the surface of the insulating covering, an opposite surface of the insulating covering which is disposed on the insulating base and defines a containment space with the insulating base, and the insulating base is disposed on a circuit board and secures the coaxial connector on the circuit board, wherein the insulating base extends a bump toward the insulating covering in the aforesaid containment space;

a movable terminal, comprising a welding portion and an engaging portion, wherein the welding portion of the movable terminal is welded on the circuit board, the movable terminal extends through a slot of a side of the insulating base and enters into the containment space, and the engaging portion of the movable terminal engages an inner edge of the slot of the insulating base thus securing the movable terminal on the insulating base, wherein a tab of the movable terminal, which is away from the engaging portion of the movable terminal, is capable to move freely;

a stationary terminal, comprising a welding portion and an opening, wherein the welding portion of the stationary terminal is welded on the circuit board, the opening of the stationary terminal is engaged to the aforesaid bump in the containment space for securing the stationary terminal on the insulating base, and a portion of the stationary terminal extends to press the tab of the movable terminal; and a shielding casing, comprising a base and a sleeve, wherein the base spans over the insulating covering and substantially covers the insulating housing, the sleeve is disposed on the base and is connected to a top surface of the base, and the extension of the insulating covering extends through the opening of the top surface of the base whereby extending into the sleeve.

2. The coaxial connector of claim 1, wherein when the coaxial plug and the coaxial connector match with each other, a outer conductor of the coaxial plug is engaged between the sleeve of the shielding casing and the extension of the insulating covering, and a center conductor of the coaxial plug passes through the through hole of the insulating covering to extend into the containment space thus pushing the tab of the movable terminal to shift downwardly and cutting off the first electrical loop among the circuit board, the movable terminal and the stationary terminal and thus allowing the center conductor, the movable terminal and the circuit board to form a second electrical loop.

3. The coaxial connector of claim 1, wherein a plurality of fixing portions are formed at the opposite surface of the insulating covering and a surface of the insulating base that contact each other, wherein the fixing portions lock with each other whereby securing the insulating covering on the insulating base.

4. The coaxial connector of claim 1, wherein a plurality of ribs are formed at a plurality of suitable locations on the opposite surface of the insulating covering so as to secure the stationary terminal.

5. The coaxial connector of claim 1, wherein the stationary terminal has a pressing member, wherein the pressing member faces toward the containment space and is pressed against the leading edge of the tab of the movable terminal.

6. The coaxial connector of claim 1, wherein the base of the shielding casing has a plurality of lateral wings, and the lateral wings cover an outer side of the insulating housing whereby providing a shielding protection for the insulating housing.

7. The coaxial connector of claim 6, wherein the lateral wings cover a plurality of appropriate locations on a surface of the insulating base contacting with the circuit board whereby securing the insulating covering and the insulating base at the outer side of the insulating housing.

* * * * *